United States Patent [19]

Noguchi et al.

[11] Patent Number: 4,688,056

[45] Date of Patent: Aug. 18, 1987

[54] LIQUID JET RECORDING HEAD HAVING A LAYER OF A RESIN COMPOSITION CURABLE WITH AN ACTIVE ENERGY RAY

[75] Inventors: Hiromichi Noguchi, Atsugi; Tadayoshi Inamoto, Machida; Megumi Munakata, Atsugi, all of Japan

[73] Assignee: Canon Kabushiki Kaisha, Tokyo, Japan

[21] Appl. No.: 881,821

[22] Filed: Jul. 3, 1986

[30] Foreign Application Priority Data

Jul. 13, 1985 [JP] Japan .............................. 60-153356
Jul. 13, 1985 [JP] Japan .............................. 60-153358

[51] Int. Cl.⁴ .......................................... G01D 15/18
[52] U.S. Cl. .............................. 346/140 R; 522/31; 522/102; 522/149; 156/668; 430/281
[58] Field of Search ................. 346/140; 522/31, 102, 522/149; 156/668; 430/281

[56] References Cited

U.S. PATENT DOCUMENTS 4,412,224 10/1983 Sugitani ........................ 346/140 X
4,509,063 4/1985 Sugitani ............................ 346/140
4,521,787 6/1985 Yokota .............................. 346/140

*Primary Examiner*—Joseph W. Hartary
*Attorney, Agent, or Firm*—Fitzpatrick, Cella, Harper & Scinto

[57] ABSTRACT

A liquid jet recording head, having a liquid passage communicated to the discharging outlet of the liquid provided on a substrate surface, said passage being formed by subjecting a layer of a resin composition curable with an active energy ray to a predetermined pattern exposure with the use of said active energy ray to thereby form a cured region of said resin composition and removing the uncured region from said layer, said resin composition comprising (i) a graft copolymerized polymer, (iii) an epoxy resin comprising at least one compound having one or more epoxy groups in the molecule and (iv) a polymerization initiator capable of generating a Lewis acid by irradiation of an active energy ray.

7 Claims, 10 Drawing Figures

8
6-1
C'
8
6-2
6-2
7
2
3H
1
C
9

LIQUID JET RECORDING HEAD HAVING A LAYER OF A RESIN COMPOSITION CURABLE WITH AN ACTIVE ENERGY RAY

BACKGROUND OF THE INVENTION

1. Field of the Invention

This invention relates to a liquid jet recording head, more particularly to a recording head for generation of small droplets of a liquid for recording to be used in a liquid jet recording system in which recording is performed by generating small droplets of a liquid for recording such as ink, etc., and attaching them onto a recording medium such as paper.

2. Related Background Art

The liquid jet recording system which performs recording by generating small droplets of a liquid for recording such as ink, etc., and attaching them onto a recording medium such as paper is attracting attention as the recording system which generates extremely little negligible noise during recording, is capable of high speed recording and a enables recording on a plain paper without requiring any special treatment such as fixing. Various types of this system have been actively studied.

The recording head portion of the recording device to be used in the liquid jet recording system generally consists of an orifice for discharging a liquid for recording (liquid discharging outlet), a liquid passage connected to the orifice and having a portion at which the energy for discharging the liquid for recording acts on the liquid for recording, and a liquid chamber for storing the liquid for recording to be fed into the liquid passage.

The energy for discharging the liquid for recording during recording is generated in most cases by means of a discharge energy generating element of various types such as heat generating element, piezoelectric element, etc., which is arranged at a predetermined position at the portion where the discharging energy is permitted to act on the liquid for recording which constitutes a part of the liquid passage (energy acting portion).

As the method for preparing the liquid jet recording head with such a constitution, there have been known, for example, the method comprising the steps of forming fine grooves on a flat plate of glass, metal, etc., by cutting or etching and bonding another appropriate plate onto the flat plate having such grooves formed thereon to thereby form liquid passages, or the method comprising the steps of forming groove walls of a cured photosensitive resin on a substrate having a discharging energy generating element arranged thereon according to the photolithographic step to provide grooves for the liquid passages on the substrate and bonding another flat plate (covering) onto the grooved plate thus formed to thereby form liquid passages (for example, Japanese Laid-open Patent Application No. 43876/1982).

Of these methods for preparation of the liquid jet recording heads, the latter method employing a photosensitive resin is more advantageous than the former method in that liquid jet recording heads can be provided with better quality and cheaper cost because it enables fine working with better precision and better yield and bulk production with ease.

As the photosensitive resin to be used in preparation of such recording heads, there have been employed those used for pattern formation in printing plates or printed wiring or those known as the photocurable coating materials or adhesives to be used for glass, metal, ceramics, etc. Also, for working efficiency, dry film type resins have been primarily utilized.

In the recording head employing a cured film of a photosensitive resin, in order to obtain excellent characteristics such as high recording characteristic, durability and reliability, etc., the photosensitive resin to be used for the recording head is required to have the following characteristics:

(1) particularly, excellent adhesion between the cured film and a substrate;

(2) excellent mechanical strength and durability, etc., when cured; and (3) excellent sensitivity and resolution during patterning by use of pattern exposure light.

However, under the present situation, none of the photosensitive resins used for formation of the liquid jet recording head hitherto known in the art satisfy all of the above requisite characteristics.

To describe in more detail, those employed for pattern formation in printing plates, printed wirings, etc., as the photosensitive resin for recording head are inferior in adhesion or close contact with glass, ceramics, plastic film, etc., to be used as the substrate, although they are excellent in sensitivity and resolution, and also insufficient in mechanical strength and durability when cured. For this reason, at the stage of preparation of recording heads, or during usage, there is involved the drawback that deformation of the resin cured film or peel-off from the substrate or damages are liable to occur, which may marked impairment in the reliability of the recording head such as lowering in recording characteristics by impeding the flow of the liquid for recording in the liquid passages or making the liquid droplet discharging direction unstable.

On the other hand, those which are known as photocurable type coating materials or adhesives to be used for glass, metals, ceramics, etc., although having advantages of excellent close contact or adhesiveness with the substrate formed of these materials and also satisfactory mechanical strength and durability obtained when cured, are inferior in sensitivity and resolution and therefore require an exposure device of higher intensity or an exposure operation of longer time. Further, their inherent characteristics cannot afford providing precise and high density pattern with good resolution, whereby there is involved the problem that it is not suitable for a recording head for which minute precise working is particularly required.

SUMMARY OF THE INVENTION

The present invention has been accomplished in view of the problems as described above and an object of the present invention is to provide a liquid jet recording head having a liquid passage wall comprising a resin cured film satisfying all of the requisite characteristics as mentioned above, which is inexpensive, precise, high in reliability and excellent in durability.

Another object of the present invention is to provide a liquid jet recording head having a constitution of which the liquid passage is minutely worked with good precision and good yield.

A further object of the present invention is to provide a liquid jet recording head which is high in reliability and excellent in durability even when formed into multi-orifices.

According to the present invention, there is provided a liquid jet recording head, having a liquid passage communicated to the discharging outlet of the liquid provided on a substrate surface, said passage being formed by subjecting a layer of a resin composition curable with an active energy ray to a predetermined pattern exposure with the use of said active energy ray to thereby form a cured region of said resin composition and removing the uncured region from said layer, said resin composition being an active energy ray-curing resin composition comprising the component (i) shown below, at least one of the components (ii) and (iii) shown below and the component (iv) shown below:

(i) a graft copolymerized polymer comprising a trunk chain composed mainly of structural units derived from at least one monomer selected from the group consisting of alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinylpyrrolidone or its derivatives, (E) vinylpyridine or its derivatives and (F) acrylamide derivatives represented by the following general formula I:

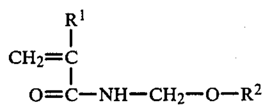

$$CH_2=C(R^1)-C(=O)-NH-CH_2-O-R^2 \quad (I)$$

(wherein $R^1$ is hydrogen or alkyl or hydroxyalkyl group having 1 to 3 carbon atoms, and $R^2$ is hydrogen or alkyl or acyl group having 1 to 4 carbon atoms which may have hydroxy group.), added to said trunk chain;

(ii) a monomer having an ethylenically unsaturated bond;

(iii) an epoxy resin comprising at least one compound having one or more epoxy groups in the molecule;

(iv) a polymerization initiator capable of generating a Lewis acid by irradiation of an active energy ray.

DESCRIPTION OF PREFERRED EMBODIMENTS

Figure 1A:
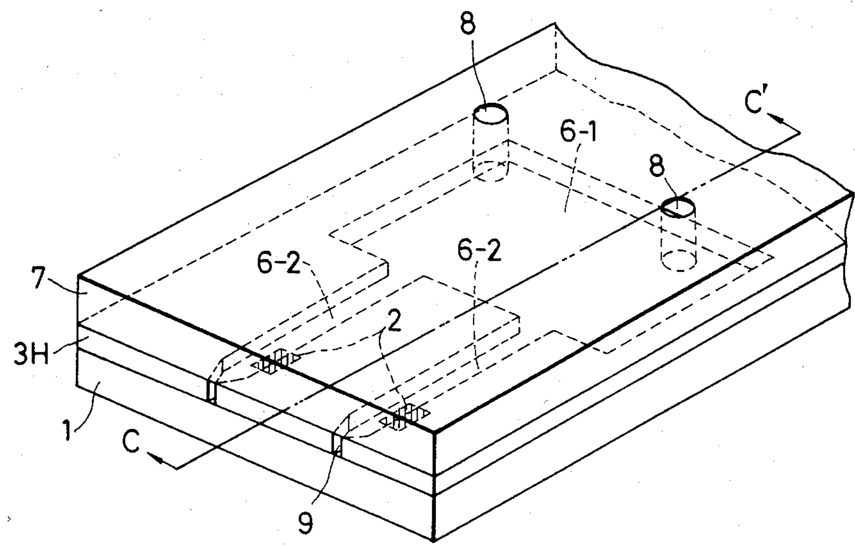
FIGS. 1A to FIGS. 6B are schematic illustrations for explanation of the liquid jet recording head of the present invention and the methods for producing the same.

Referring now to the drawings, the liquid jet recording head of the present invention is described in detail.

Figure 1B:
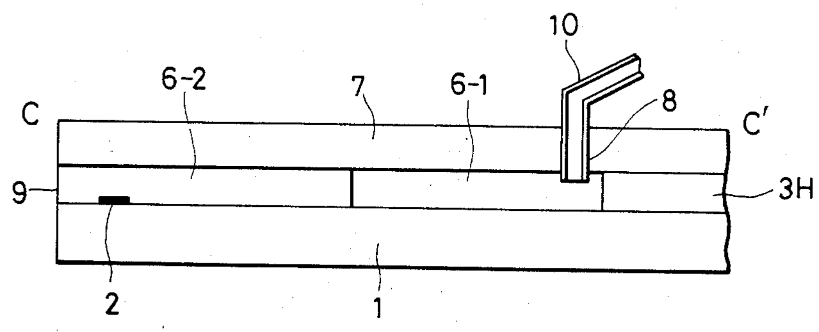

FIG. 1 is an embodiment of the liquid recording head of the present invention, FIG. 1A showing a perspective view of the main portion thereof and FIG. 1B showing a sectional view of FIG. 1A cut along the line C—C'.

The liquid jet recording head comprises basically a substrate 1, a resin cured film 3H provided on said substrate 1 and subjected to patterning to a desired shape and a covering 7 laminated on said resin cured film 3H, and these members form an orifice 9 for discharging a liquid for recording, liquid passages 6-2 communicated to said orifice 9 and having the portions at which the energy for discharging the liquid for recording acts on the liquid for recording and a liquid chamber 6-1 for storing the liquid for a recording to be supplied into said liquid passages 6-2. Further, at the through-hole 8 provided on the covering 7, a feeding pipe 10 for feeding the liquid for recording into the liquid chamber 6-1 is bonded to the outside of the recording head. In FIG. 1A, the feeding pipe 10 is omitted.

During recording, the energy for discharging the liquid for recording is generated by applying discharging signals as desired on the discharge energy generating elements 2 of various types such as heat-generating elements, piezoelectric elements, etc., arranged at predetermined positions in the portions for imparting the discharging energy on the liquid for recording constituting a part of the liquid passages 6-2 through wirings (not shown) connected to these elements 2.

The substrate 1 constituting the recording head of the present invention comprises a glass, ceramic, plastic or metal and the generating elements 2 are arranged in a desired number at predetermined positions. In the embodiment of FIG. 1, two generating elements are provided, but the number and arrangement of the heat generating elements are determined depending on the desired constitution of the recording head.

On the other hand, the covering 7 comprises a flat plate of glass, ceramic, plastic or metal and is bonded onto the resin cured film 3H by fusion or adhesion with the use of an adhesive, and it is also provided with a through-hole 8 for connecting a feeding pipe 10 at a predetermined position.

In the recording head of the present invention, the resin cured film 3H subjected to patterning to a predetermined shape constituting the liquid passages 6-2 and the liquid chamber 6-1 has been obtained by subjecting a layer comprising a resin composition with the composition as described below on the substrate 1 or on the covering 7 to patterning according to the photolithographic step. Also, said resin cured film 3H may be subjected to patterning as integrated with the covering comprising a resin composition having the composition as described below.

The resin composition to be used for formation of a resin cured product provided on a substrate for constituting at least a portion which becomes the liquid passage is an active energy ray curing type resin composition comprising:

(i) a graft copolymerized polymer comprising a trunk chain composed mainly of structural-units derived from at least one monomer selected from the group consisting of alkyl methacrylates, acrylonitrile and styrene, having graft chains composed mainly of structural units derived from at least one monomer selected from (A) hydroxyl containing acrylic monomers, (B) amino or alkylamino containing acrylic monomers, (C) carboxyl group containing acrylic or vinyl monomers, (D) N-vinylpyrrolidone or its derivatives, (E) vinylpyridine or its derivatives and (F) acrylamide derivatives represented by the following formula I:

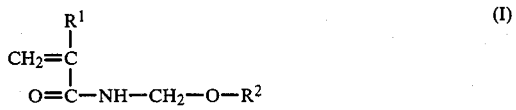

$$CH_2=C(R^1)-C(=O)-NH-CH_2-O-R^2 \quad (I)$$

(wherein $R^1$ represents hydrogen or an alkyl or hydroxyalkyl group having 1 to 3 carbon atoms, and $R^2$ represents hydrogen or an alkyl or acyl group having 1 to 4 carbon atoms which may have hydroxy group.), added to said trunk chain; and (ii) a monomer having an ethylenically unsaturated bond; and/or (iii) an epoxy resin comprising at least one compound having one or more epoxy groups in the molecule; and (iv) a polymerization initiator capable of generating a Lewis acid by irradiation of an active energy ray, having good adhesion to a substrate comprising glass, plastic, ceramics, etc., particularly when formed into a cured film, being also excellent in resistance to the liquid for recording such as ink as well as mechanical strength, and further having the excellent characteristic as the constituent member of a liquid jet recording head that a precise and high resolution pattern can be formed by patterning with an active energy ray. Further, the resin composition can be used as a dry film, and also in that case, the above excellent characteristics can be exhibited.

The composition of the active energy curing type resin composition to be used for formation of the recording head of the present invention is described in detail below.

The graft copolymerized polymer (i) which is the essential component of the active energy ray-curing resin composition comprises a trunk chain having relatively rigid properties suitable for a structural material having graft chains composed mainly of the above monomers (A)–(F) having hydrophilic property and exhibiting excellent adhesion to the substrate added thereto.

In constituting the above graft copolymerized polymer, specific examples of the monomers (A)–(F) to be used for constitution of the graft chains are shown below. Examples of the acrylic monomer containing hydroxyl group(s) of (A) include 2-hydroxyethyl(meth)acrylate [hereinafter, (meth)acrylate means to include both acrylate and methacrylate], 2-hydroxypropyl(meth)acrylate, 3-chloro-2-hydroxypropyl(meth)acrylate, 4-hydroxybutyl(meth)acrylate, 3-hydroxybutyl(meth)acrylate, 5-hydroxypentyl(meth)acrylate, 6-hydroxyhexyl(meth)acrylate, or monoester of 1,4-cyclohexanedimethanol with acrylic acid or methacrylic acid, including those obtained under the trade names of Aronix M5700 (produced by Toa Gosei Kagaku K.K.), TONE M100 (caprolactone acrylate, produced by Union Carbide). Light Ester HO-mpp (produced by Kyoeisha Yushi Kagaku Kogyo K.K.), Light Ester M-600A (trade name of 2-hydroxy-3-phenoxypropylacrylate, produced by Kyoeisha Yushi Kagaku Kogyo K.K.), and also monoesters of divalent alcohols such as 1,10-decanediol, neopentylglycol, bis(2-hydroxyethyl)terephthalate, bisphenol A and addition products of ethylene oxide or propylene oxide with (meth)acrylic acid.

Examples of the amino or alkylamino containing acrylic monomer of (B) include (meth)acrylamide, N,N-dimethylaminoethyl(meth)acrylamide, N,N-dimethyl(meth)acrylamide, N,N-dimethylaminopropyl(meth)acrylamide, N,N-di-t-butylaminoethyl(meth)acrylamide and the like.

Examples of the carboxyl containing acrylic or vinyl monomer of (C) include (meth)acrylic acid, fumaric acid, itaconic acid or those known under the trade names of Aronix M-5400, Aronix M-5500, etc.

Examples of vinylpyridine or its derivatives of (E) include 2-vinylpyridine, 4-vinylpyridine, 2-vinyl-6-methylpyridine, 4-vinyl-1-methylpyridine, 2-vinyl-5-ethylpyridine, 4-(4-pipenilinoethyl)pyridine and the like.

The above monomers (A)–(E) all have hydrophilic properties and impart firm adhesion when the resin composition used in the present invention is adhered to a substrate such as glass, ceramic, plastic, etc.

Examples of the acrylamide derivative represented by the formula I of (F) include monomers having hydrophilic property and also heat cross-linkability such as N-methylol(meth)acrylamide, N-propoxymethyl(meth)acrylamide, N-n-butoxymethyl(meth)acrylamide, β-hydroxyethoxymethyl(meth)acrylamide, N-ethoxymethyl(meth)acrylamide, N-methoxymethyl(meth)acrylamide, α-hydroxymethyl-N-methylolacrylamide, α-hydroxy-ethyl-N-butoxymethylacrylamide, α-hydroxypropyl-N-propoxymethylacrylamide, α-ethyl-N-methylolacrylamide, α-propyl-N-methylolacrylamide and the like. These monomers (F) have hydrophilic property as a matter of course, and also condensing cross-linkability by heating, and will generally form crosslinked bonds by elimination of water molecules or alcohol at a temperature of 100° C. or higher, thereby to form a network structure also in the graft copolymerized polymer itself after curing, whereby the pattern obtained by curing can be further improved in chemical resistance and mechanical strength, etc., to make the present invention more effective.

Also, to the above monomers (A)–(F), monomer which can be crosslinked by ring opening by heat such as glycidyl(meth)acrylate may be partially added to constitute the graft chains, whereby the same effect as in the above (F) can be obtained.

In addition to the above thermal crosslinking, for the same purpose, it is also effective to crosslink the graft copolymerized polymer with an active energy ray by introducing a photopolymerizable monomer into a part of the graft chains of the graft copolymer. As the method for imparting photopolymerizability to the graft chain, there may be employed for example, (i) the method in which a carboxyl containing monomer exemplified by (meth)acrylic acid, etc., or an amino or tertiary amine containing monomer is copolymerized, followed by the reaction with glycidyl(meth)acrylate, etc.;

(j) the method in which a partial urethane compound of polyisocyanate having one isocyanate group and one or more acrylic ester groups in one molecule is reacted with the hydroxyl group, amino group or carboxyl group in the graft chain;

(k) the method in which acrylic acid chloride is reacted with the hydroxyl groups in the graft chain;

(l) the method in which an acid anhydride is reacted with the hydroxyl group in the graft chain, followed by the reaction with glycidyl(meth)acrylate;

(m) the method in which the hydroxyl group in the graft chain is condensed with the condensing crosslinkable monomer as exemplified in (F), thereby leaving acrylamide group in the side chain;

(n) the method in which the hydroxyl group in the graft chain is reacted with glycidyl(meth)acrylate; etc.

When the graft chain of the graft copolymerized polymer is heat crosslinkable, it is preferably to perform heating after formation of a pattern by irradiation of an active energy ray. On the other hand, also when the above graft chain is photopolymerizable, there is no problem in performing heating within the range permissible with respect to the heat resistance of the substrate, and rather preferable results can be given by heating.

The graft chains are not limited to those derived only from the hydrophilic monomers as exemplified by the above (A)-(F), but the graft chains may also contain various hydrophobic monomers which can exhibit various other functions as the copolymer component within the range of 0 to about 25 weight %.

The monomer constituting the trunk chain of the graft copolymerized polymer is an alkyl methacrylate having 1 to 4 carbon atoms in the alkyl group such as methyl methacrylate, ethyl methacrylate, isobutyl methacrylate, t-butyl methacrylate, etc., acrylonitrile and styrene.

The trunk chain is not limited to those derived from only the above monomers, but it may be also a trunk chain using other monomers such as methyl acrylate, ethyl acrylate, n-butyl acrylate, lauryl acrylate, n-butyl methacrylate, 2-ethylhexyl methacrylate, glycidyl methacrylate, vinyl acetate, etc., as the copolymer component within the range of 0 to about 50 weight %.

In the resin composition for formation of the recording head in the present invention, the above trunk chain gives high cohesive strength to the composition. The composition can be provided in various shapes such as solutions or solid films, etc. However, when it is practically used as the dry film, it is preferable to use a relatively rigid trunk chain having a glass transition temperature of about 50° C. or higher in order to maintain the composition in the shape of a film. In this case, the trunk chain to be used may be constituted of two or more kinds having different glass transition temperatures. On the other hand, when the composition is to be used as a solution, it is possible to use a trunk chain having a low glass transition temperature so as to give the composition flexibility. However, also in this case, in order to obtain a pattern having excellent resistance to the liquid for recording and high mechanical strength, it is preferable to use a trunk chain having a high glass transition temperature.

The graft copolymerized polymers to be used for the resin composition for formation of a resin cured film in the present invention may be classified broadly into those having no curability, those having photocrosslinkability and those having heat crosslinkability. In either case, the graft copolymerized polymer enables precise patterning by imparting form maintaining property to the composition in the curing steps (namely active energy ray irradiation and optional heat curing) of the said composition, and also gives excellent adhesiveness, chemical resistance as well as high mechanical strength to the pattern obtained by curing.

The above graft copolymerized polymer to be used in the composition of the present invention can be prepared according to the known methods, specifically by various methods as disclosed in "Base and Application of Polymer Alloy" p. 10-35 (edited by Polymer Society of Japan, published by Tokyo Kagaku Dojin K.K., 1981). Examples of those methods include (1) the chain transfer method, (2) the method by use of radiation, (3) the oxidation polymerization method, (4) the ion graft polymerization method and (5) macromonomer method. For the graft copolymer to be used in the present invention, since the surface active effect is marked when the length of the graft chains are uniform, it is preferable to use the method of (4) and (5), particularly preferably the macromonomer method of (5) which is advantageous in design of materials. The graft copolymer should preferably have a weightaverage molecular weight of about 5000 to 300000 and, when used as a dry film, preferably about 30000 to 300000.

The monomer (ii) having an ethylenically unsaturated bond to be used in the resin composition for formation of a resin cured film in the present invention is a component for permitting the said composition to exhibit curability with an active energy ray, particularly imparting excellent sensitivity to an active energy ray to the said composition, similarly as the epoxy resin (iii) as hereinafter described. The said monomer (ii) should preferably have a boiling point of 100° C. or higher under atmospheric pressure, having preferably two or more ethylenically unsaturated bonds, and various known monomers curable by irradiation of an active energy ray can be used.

Specific examples of such monomers having two or more ethylenically unsaturated bonds include (a) acrylic acid esters of methacrylic acid esters of polyfunctional epoxy resins having two or more epoxy groups in one molecule, (b) acrylic acid esters or methacrylic acid esters of alkyleneoxide addition products of polyhydric alcohols, (c) polyester acrylates having acrylic acid ester group at the terminal ends of the molecular chains of polyesters having molecular weights of 500 to 3000 comprising dibasic acid and dihydric alcohol, (d) the reaction products between polyisocyanates and acrylic acid monomers having hydroxyl groups. The above monomers (a)-(d) may be urethane-modified products having urethane bonds in the molecules.

Examples of the monomers belonging to (a) include acrylic acid or methacrylic acid esters of polyfunctional epoxy resins to be used for formation of the epoxy resin as hereinafter described.

Examples of the monomers belonging to (b) include ethyleneglycol di(meth)acrylate, diethyleneglycol di(meth)acrylate, polyethyleneglycol di(meth)acrylate, 1,6-hexanediol di(meth)acrylate, polyethyleneglycol di(meth)acrylate, pentaerythritol tri(meth)acrylate and the like, and those known under the trade names of KAYARAD HX-220, HX-620, D-310, D-320, D-330, DPHA, R-604, DPCA-20, DPCA-30, DPCA-60, DPCA-120 (all produced by Nippon Kayaku K.K.), and also those known under the trade names of NK ester BPE-200, BPE-500, BPE-1300, A-BPE-4 (all produced by Shin Nakamura Kagaku K.K.), etc., may also be available.

The monomers belonging to (c) may be exemplified by those known under the trade names of Aronix M-6100, M-6200, M-6250, M-6300, M-6400, M-7100, M-8030, M-8060, M-8100 (all produced by Toa Gosei Kagaku K.K.). Examples of the monomers belonging to (c) and having urethane bonds of polyester include those known under the trade names of Aronix M-1100, Aronix M-1200, (both produced by Toa Gosei Kagaku K.K.).

The monomers belonging to (d) may include the reaction products between polyisocyanate such as tolylene diisocyanate, isophorone diisocyanate, hexamethylene diisocyanate, trimethylhexamethylene diisocyanate, lysine diisocyanate, diphenylmethane diisocyanate or the like with a hydroxyl containing acrylic monomer, and it is possible to use the reaction products having (meth)acrylic acid esters containing hydroxyl group(s) added to polyisocyanate compounds known under the trade names of Sumidule N (buret derivative of hexamethylene diisocyanate), Sumidule L (trimethylolpropane modified product of tolylene diisocyanate) (all produced by Sumitomo Bayer Urethane K.K.), etc. The hydroxyl containing acrylic monomer as herein mentioned may include typically (meth)acrylic acid esters, preferably hydroxyethyl (meth)acrylate, hydroxypropyl (meth)acrylate. It is also possible to use other acrylic monomers containing hydroxyl group(s) mentioned in the present specification as useful for the graft chains in the graft copolymerized polymer.

In addition to the monomers having two or more ethylenically unsaturated bonds as mentioned above, it is also possible to use monomers having only one ethylenically unsaturated bond as mentioned below together with these monomers. To exemplify such monomers having one ethylenically unsaturated bond, there may be included, for example, carboxyl containing unsaturated monomers such as acrylic acid, methacrylic acid or the like; glycidyl containing unsaturated monomers such as glycidyl acrylate, glycidyl methacrylate or the like; $C_2$–$C_8$ hydroxyalkyl esters of acrylic acid or methacrylic acid such as hydroxyethyl acrylate, hydroxyethyl methacrylate, hydroxypropyl acrylate, hydroxypropyl methacrylate or the like; monoesters of acrylic acid or methacrylic acid with polyethyleneglycol or polypropyleneglycol such as polyethyleneglycol monoacrylate, polyethyleneglycol monomethacrylate, polypropyleneglycol monoacrylate, polypropyleneglycol monomethacrylate or the like; $C_1$–$C_{12}$ alkyl or cycloalkyl esters of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacrylate, ethyl methacrylate, propyl methacrylate, isopropyl methacrylate, butyl methacrylate, isopropyl methacrylate, butyl methacrylate, hexyl methacrylate, octyl methacrylate, lauryl methacrylate, cyclohexyl methacrylate or the like; other monomers such as styrene, vinyltoluene, methylstyrene, vinyl acetate, vinyl chloride, vinyl isobutyl ether, acrylonitrile, acrylamide, methacrylamide, acrylic acid or methacrylic acid adduct of alkylglycidyl ether, vinylpyrrolidone, dicyclopentenyloxyethyl(meth)acrylate, ε-caploractone-modified hydroxyalkyl(meth)acrylate, tetrahydrofurfulyl acrylate, phenoxyethyl acrylate; and others.

By use of the above monomer (ii) having ethylenically unsaturated bonds, high sensitivity and satisfactory curability to an active energy ray can be imparted to the resin composition for formation of a resin cured film in the present invention.

The epoxy resin (iii), comprising one or more compounds having one or more epoxy groups in one molecule to be used in the resin composition for formation of a resin cured film in the present invention, is a component which permits the said composition to exhibit high sensitivity and satisfactory curability together with the monomer (ii) having ethylenically unsaturated bonds as described above by the action of the polymerization initiator (iv) as described hereinafter and, in addition thereto, imparts better adhesiveness with a substrate, water resistance, chemical resistance, dimensional stability, etc., to the cured film constituting the said resin composition, when it is formed by coating the said resin composition in liquid state on substrates comprising glass, plastics, ceramics, etc., followed by curing, or when it is used in the form of a dry film adhered on substrates.

In the resin composition for formation of a resin cured film in the present invention, any epoxy resin comprising at least one compound containing one or more epoxy groups in one molecule can be used without particular limitation. However, in view of, for example, chemical resistance or mechanical strength of the cured film obtained by curing of the said resin composition or high durability as a construction material, or in view of workability during formation of patterns comprising the cured film of the said composition on a substrate or resolution of the patterns formed, it is preferable to use an epoxy resin comprising at least one kind of compound containing two or more epoxy groups in one molecule.

Examples of the above epoxy resin containing 2 or more epoxy groups in one molecule include epoxy resins as represented by the bisphenol A type, novolac type, alicyclic type, or polyfunctional epoxy resins such as bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether and epoxyurethane resins represented by the following formula II:

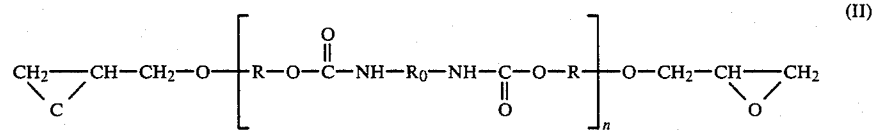

(wherein R represents an alkylene group or an oxyalkylene group, $R_0$ represents

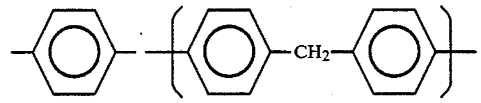

or an alkylene group), and mixtures of at least one of them.

Specific examples of these polyfunctional epoxy of resins include those as mentioned below. That is, the bisphenol A type epoxy resin may be, for example, Epicoat 828, 834, 871, 1001, 1004 (trade names, produced by Shell Chemical Co.), DER 331-J, 337-J, 661-J, 664-J, 667-J (produced by Dow Chemical Co.), and Epicrone 800 (trade name, produced by Dainippon Ink Kagaku K.K.), etc. The novolac type epoxy resin may be, for example, Epicoat 152, 154, 172 (trade names, produced by Shell Chemical Co.), Allaldite EPN 1138 (trade name, produced by Ciba Geigy Co.), DER 431, 438 and 439 (trade names, produced by Dow Chemical Co.), etc. The alicyclic epoxy resin may be, for example, Araldite CY-175, -176, -179, -182, -184, -192 (trade names, produced by Ciba Geigy Co.), Chissonox 090, 091, 092, 301, 313 (trade names, produced by Chisso K.K.), CYRACURE 6100, 6110, 6200 and ERL 4090, 4617, 2256, 5411 (trade names, produced by Union Carbide Co.), etc. The polyglycidyl ether by aliphatic polyhydric alcohol may be, for example, ethyleneglycol diglycidyl ether, polyethyleneglycol diglycidyl ether, propyleneglycol diglycidyl ether, polypropyleneglycol diglycidyl ether, neopentylglycol diglycidyl ether, 1,6-hexanediol diglycidyl ether, glycerine diglycidyl ether, trimethylolpropane triglycidyl ether, diglycidyl ether of hydrogenated bisphenol A, 2,2-dibromoneopentylglycol diglycidyl ether etc.; the polyglycidyl ether derived from aromatic polyhydric alcohol may be, for example, diglycidyl ether of an addition product of bisphenol A added with 2 to 16 mols of alkyleneoxide, a diglycidyl ether of an addition product of bisphenol F added with 2 to 16 molsof alkyleneoxide, a diglycidyl ether of an addition product of bisphenol S added with 2 to 16 mols of alkyleneoxide.

On the other hand, examples of the compounds containing one epoxy group in one molecule include olefin oxide, octylene oxide, butyl glycidyl ether, glycidyl methacrylate, allyl glycidyl ether, styrene oxide, phenyl glycidyl ether, n-butylphenol glycidyl ether, 3-pentadecylphenyl glycidyl ether, cyclohexenevinyl monoxide, α-pinene oxide, glycidyl ester of tertcarboxylic acid and mixtures thereof.

These monofunctional epoxy resins can be used together with the polyfunctional epoxy resin as mentioned above or also individually alone.

In the resin composition for formation of a resin cured film in the present invention, the above epoxy resin (iii) has high sensitivity and satisfactory curability to an active energy ray generated by the action of the Lewis acid, which is generated by irradiating the polymerization initiator (iv) as described below with the active energy ray, on the epoxy groups of the resin, thereby enabling precise and high resolution pattern formation with the said resin composition through its curability together with the monomer (ii) having ethylenically unsaturated bonds as described above, but also in addition thereto imparting good adhesion to a substrate, chemical resistance, dimensional stability, etc., through heat curability possessed inherently by the epoxy resin.

The polymerization initiator (iv) capable of generating a Lewis acid by irradiation of an active energy ray to be used in the resin composition for formation of a resin cured film in the present invention is a component for curing the epoxy resin (iii) as mentioned above with the action of the Lewis acid, which permits the said resin composition to exhibit high sensitivity and satisfactory curability to an active energy ray together with the monomer (ii) having ethylenically unsaturated bond(s) as described above. As such a polymerization initiator (iv), there may be preferably used, for example, aromatic onium salt compounds having photosensitivity containing an element belonging to the groups VIa as disclosed in Japanese Patent publication No. 14278/1977 or aromatic onium salt compounds having photosensitivity containing an element belonging to the group Va as shown in Japanese Patent publication No. 14279/1977 or aromatic halonium salts having photosensitivity as shown in Japanese Patent publication No. 147277/1977. These aromatic onium salt compounds or aromatic halonium salts all have the characteristic of curing the epoxy resin (iii) by releasing a Lewis acid by irradiation with an active energy ray.

The aromatic onium salt compounds having photosensitivity of the element belonging to the group VIa or the group Va may include typically the compounds of the following formula III:

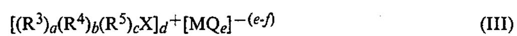

$$[(R^3)_a(R^4)_b(R^5)_cX]_d{}^+[MQ_e]^{-(e-f)} \quad \text{(III)}$$

(wherein $R^3$ is a monovalent organic aromatic group, $R^4$ is a monovalent organic aliphatic group selected from alkyl groups, cycloalkyl groups and substituted alkyl groups, $R^5$ is a polyvalent organic group for constituting heterocyclic or fused ring structure selected from aliphatic groups and aromatic groups, X is an element belonging to the group VIa selected from sulfur, selenium and tellurium or an element belonging to the group Va selected from nitrogen, phosphorus, arsenic, antimony and bismuth, M is a metal or metalloid and Q is halogen, a is an integer of 0 to 3 when X is an element belonging to the group VIa or an integer of 0 to 4 when X is an element belonging to the group Va, b is an integer of 0 to 2, c is an integer of 0 or 1 when X is an element belonging to the group VIa or an integer of 0 to 2 when X is an element belonging to the group Va, f is an integer of 2 to 7 representing the valence of M, e is an integer which is greater than f but not more than 8, and the sum of a, b and c is 3 when X is an element belonging to the group VIa or 4 when X is an element belonging to the group Va, and $d=e-f$).

On the other hand, the photosensitive aromatic halonium salt may be exemplified by the following formula IV:

$$[(R^6)_g(R^7)_hX]_i{}^+[MQ_j]^{-(k-l)} \quad \text{(IV)}$$

(wherein $R^6$ is a monovalent aromatic organic group, $R^7$ is a divalent aromatic organic group, X is halogen, M is a metal or metalloid and Q is halogen, respectively, g is an integer of 0 or 2 and h is an integer of 0 or 1, with the sum of g and h being equal to 2 or the valence of X, i being equal to $k-l$, l is an integer of 2 to 7 of up to 8 which is greater than l).

Specific examples of the photosensitive aromatic onium salt compounds containing an element belonging to the group VIa or the group Va which can be formulated in the resin composition for formation of a resin cured film in the present invention may include the photosensitive aromatic onium salts of the elements belonging to the group VIa as shown below.

(a)

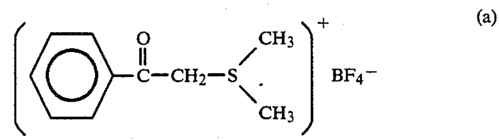

(b)

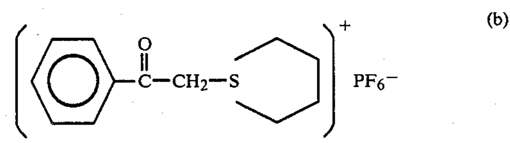

(c)

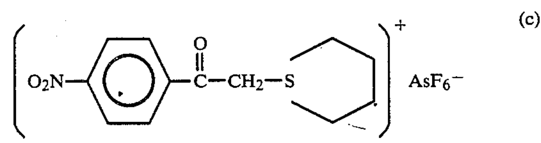

(d)

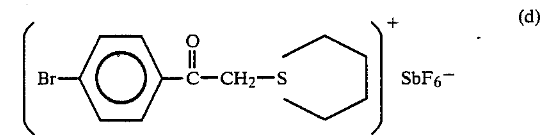

-continued
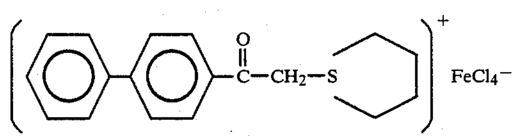
(e)
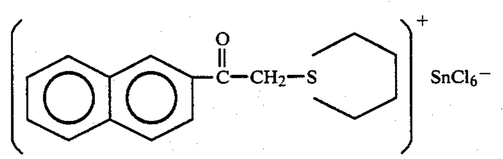
(f)
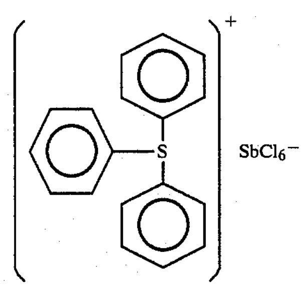
(g)
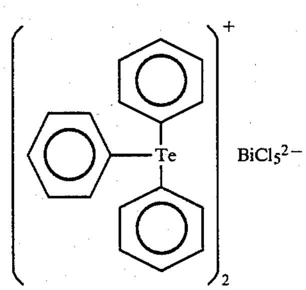
(h)
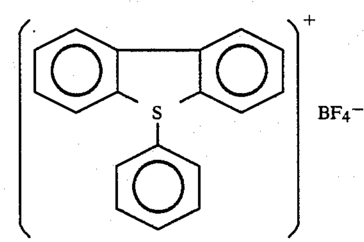
(i)
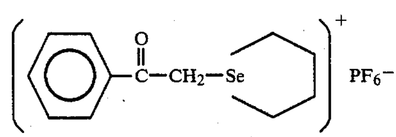
(j)
and photosensitive aromatic onium salts of the elements belonging to the group Va as shown below:
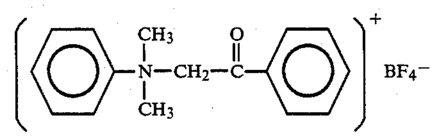
(1)
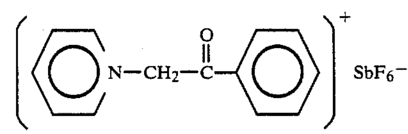
(2)
-continued
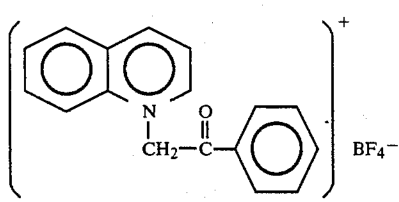
(3)
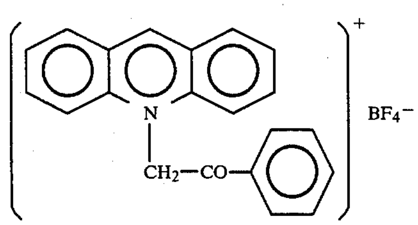
(4)
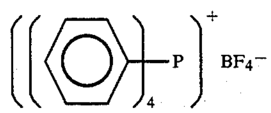
(5)
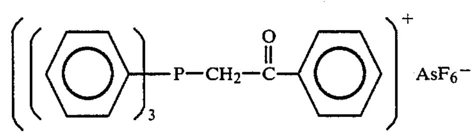
(6)
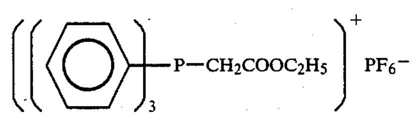
(7)
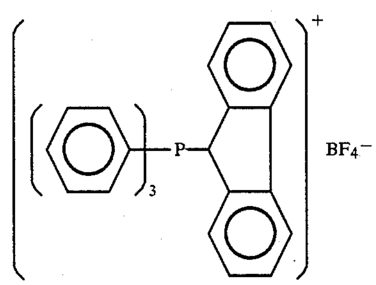
(8)
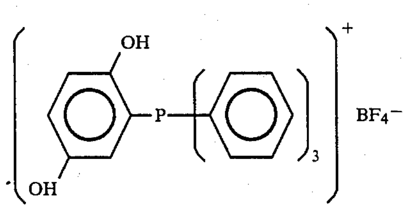
(9)
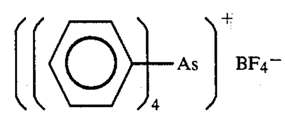
(10)

-continued

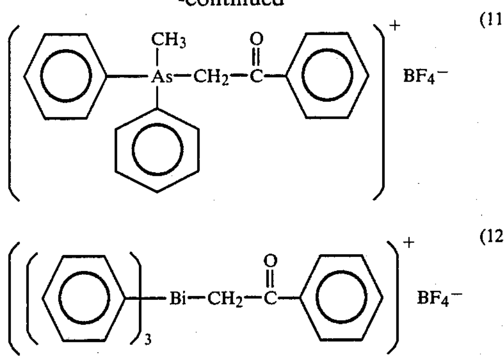

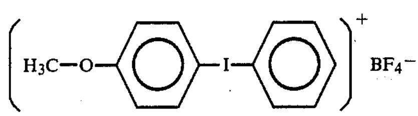

Specific example of the photosensitive aromatic halonium salts include, for example,

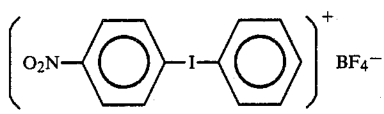

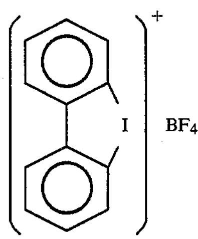

(C)

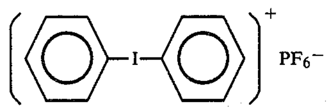

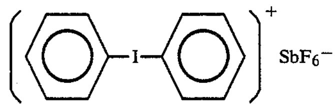

In addition to the polymerization initiator (iv) releasing a Lewis acid as described above, it is also possible to employ, if desired, curing agents generally employed widely as the curing agent for epoxy resins, such as polyamine, polyamide, acid anhydride, boron trifluoride-amine complex, dicyandiamide, imidazoles, complexes of imidazole with metal, etc.

In the active energy ray-curing resin composition for formation of a resin cured film in the present invention, a radical polymerization initiator capable of forming organic free radicals which can be activated by the action of an active energy ray may be added, in addition to the polymerization initiator (iv) as herein mentioned, for the purpose of imparting further excellent curability to an active energy ray to the monomer (ii) having ethylenically unsaturated bonds as described above, or when employing a graft copolymerized polymer (i) having photopolymerizability. Particularly, in the case when employing a graft copolymerized polymer (i) having photopolymerizability and an active energy ray with a wavelength of 250 nm to 450 nm, it is preferable to use the radical polymerization initiator as mentioned above together with the above polymerization initiator (iv). As the radical polymerization initiator, known substances having the property of being activated with an active energy ray, forming organic free radicals and initiating radical polymerization can be used without any particular limitation.

Specific examples of such radical polymerization initiators include benzyl, benzoin alkyl ethers such as benzoin isobutyl ether, benzoin isopropyl ether, benzoin-n-butyl ether, benzoin ethyl ether, benzoin methyl ether and the like; benzophenones such as benzophenone methyl ether and the like; anthraquinones such as 2-ethylanthraquinone, 2-t-butylanthraquinone and the like; xanthones such as 2,4-dimethylthioxanthone, 2,4-diisopropylthioxanthone and the like; acetophenones such as 2,2-dimethoxy-2-phenylacetophenone, $\alpha$, $\alpha$-dichloro-4-phenoxyacetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g., Irugacure 184, produced by Ciba Geigy Co.), 1-(4-isopropylphenyl)-2-hydroxy-2-methylpropane-1-one (e.g. propane-1-one (Darocure 1173, produced by MERCK Co.); etc., as preferable ones. In addition to these radical polymerization initiators, amino compounds may be added as the photopolymerization accelerator.

The amino compounds to be used as the photopolymerication accelerator may include ethanolamine, ethyl-4-dimethylaminobenzoate, 2-(dimethylamino)ethylbenzoate, p-dimethylaminobenzoic acid n-amylester, p-dimethylaminobenzoic acid isoamyl ester, etc.

The constitutional ratio of the above materials constituting the active energy ray-curing resin composition for formation of a resin cured film in the present invention may be preferably such that $G/(G+M+E)$ is within the range from 0.2 to 0.8 and $E/(E+M)$ within the range from 0.3 to 0.7, wherein G is the content in parts by weight, for the graft copolymerized polymer (i), M for the monomer having ethylenically unsaturated bonds (ii) and E for the epoxy resin (iii), and the polymerization initiator (iv) preferably 0.2 to 15 parts by weight per 100 parts by weight of $(G+M+E)$ (in the above formula, either one of M and E may be zero).

If $G/(G+M+E)$ is smaller than 0.2, the content of the graft copolymerized polymer in the said resin composition becomes so small that satisfactory adhesiveness with a substrate based on the graft copolymerized polymer can not be exhibited, or the drying property of the solvent when employing a solvent may be worsened to make the surface of the pattern obtained by curing sticky. On the other hand, if $G/(G+M+E)$ is in excess of 0.8, the content of the monomer having ethylenically unsaturated bond(s) and the epoxy resin in the said resin composition is reduced, whereby sensitivity to the active energy ray may be lowered to retard curing speed during pattern formation, or lower resolution of the pattern formed, and the pattern obtained by curing may be lowered in mechanical strength and chemical resistance.

When a radical polymerization initiator activated by the action of an activation energy ray is used in the resin composition for formation of a resin cured film in the present invention, the polymerization initiator may be added in an amount within the range from 0.1 to 20 parts by weight, preferably from 1 to 10 parts by weight based on 100 parts by weight of the resin components comprising the graft copolymerized polymer (i), the monomer having ethylenically unsaturated bonds (ii) and the epoxy resin (iii) [(i)+(ii)+(iii)]. In the above formula, the case when either one of (ii) and (iii) is zero is also included.

As the solvent to be used when employing the active energy ray-curing resin composition for formation of a resin cured film in the present invention in the form of a solution or when coating the composition on a plastic film which is a film substrate in formation of a dry film, hydrophilic solvents such as alcohols, glycol ethers, glycol esters, etc., may be employed. Of course, it is also possible to use mixtures comprising these hydrophilic solvents as the main component, mixed optionally at appropriate proportions with ketones such as methyl ethyl ketone, methyl isobutyl ketone, etc., esters such as ethyl acetate, isobutyl acetate, etc., aromatic hydrocarbons such as toluene, xylene, etc., and their halogen derivatives, aliphatic solvents containing chlorine such as methylene chloride, 1,1,1-trichloroethane, etc. These solvents can be also used as the developer for the resin composition after patterning.

The active energy ray-curing resin composition for formation of a resin cured film in the present invention may further contain in addition to the above radical polymerization initiator or the solvent as described above, additives such as catalysts for condensation crosslinking, heat polymerization inhibitors, colorants (dyes and pigments), fine particulate fillers, adhesion promotors, plasticizers, etc., if desired.

The condensation crosslinking catalyst may include sulfonic acids, typically p-toluenesulfonic acid, carboxylic acids such as formic acid, etc. The heat polymerization inhibitor may include hydroquinone and derivatives thereof, p-methoxyphenol, phenothiazine, etc. As the colorant there can be added oil-soluble dyes and pigments within the range which do not substantially prevent transmission of the active energy ray. As the filler, for enhancement of hardness of coating, as well as for enhancement of coloration, adhesion, mechanical strength, there may be employed extender pigments, plastic fine particles, etc., which are used in coating materials in general. As the adhesion promotor, silane coupling agents, low molecular surfactants as inorganic surface modifiers may be effectively used in the composition of the present invention.

The resin composition comprising the composition as described above is cured with an active energy ray to form the resin cured film 3H possessed by the recording head of the present invention. Next, as an embodiment of the case when employing a dry film type as the resin composition for formation of the resin cured film 3H, the method for preparing the liquid jet recording head of the present invention is described in detail by referring to the drawings.

FIGS. 2 to 6 are schematic illustrations for description of the preparation procedure of the liquid jet recording head of the present invention.

Figure 2:
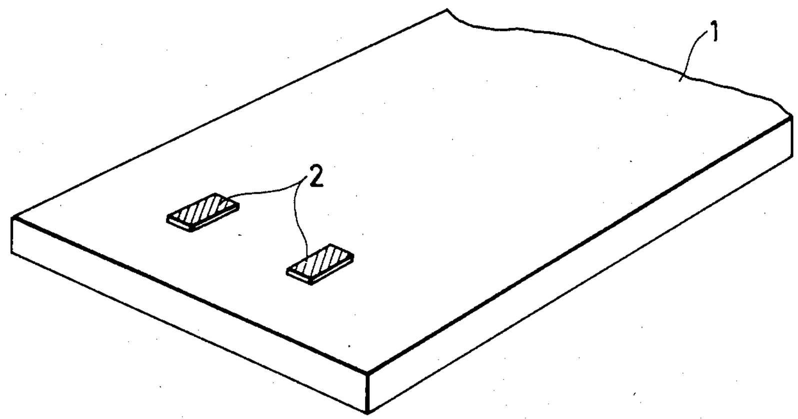

For formation of the liquid jet recording head of the present invention, first, as shown in FIG. 2, a discharge energy generating element 2 such as heat generating element or piezoelectric element is arranged in a desired number on a substrate 1 such as glass, ceramic, plastic or a metal. If desired, for the purpose of imparting resistance to the liquid for recording or electrical insulating property, etc., to the surface of the substrate 1, the surface may be coated with a protective layer of $SiO_2$, $Ta_2O_5$, glass, etc. Also, to the discharge energy generating element 2 is connected electrodes for inputting recording signals, although not shown in the drawing.

Figure 3A:
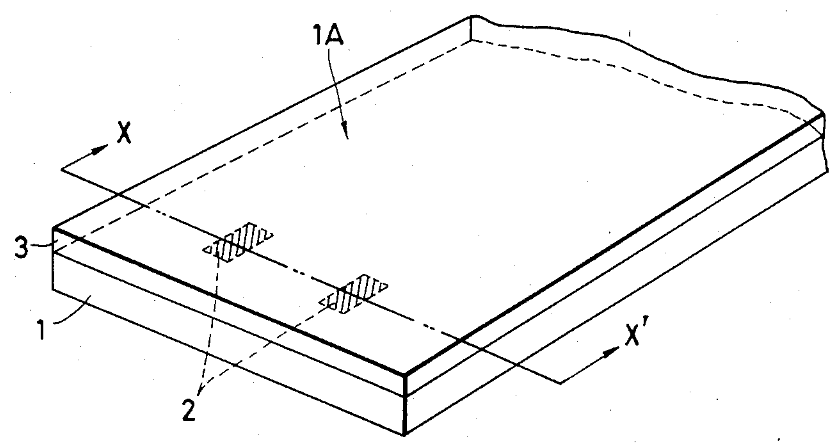
Figure 3B:
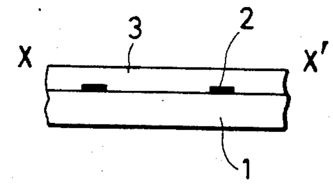

Next, the surface of the substrate 1 obtained after the step shown in FIG. 2 is cleaned and at the same time dried at, for example, 80° to 150° C., and then the active energy ray-curing resin composition 3 as described above of the dry film type (film thickness, about 25 μm to 200 μm), as shown in FIG. 3A and FIG. 3B is heated to about 40° to 150° C. and laminated on the substrate surface 1A at a speed of, for example, 0.5 to 0.4 f/min. under the pressurizing condition of 1 to 3 $Kg/cm^2$.

Figure 4:
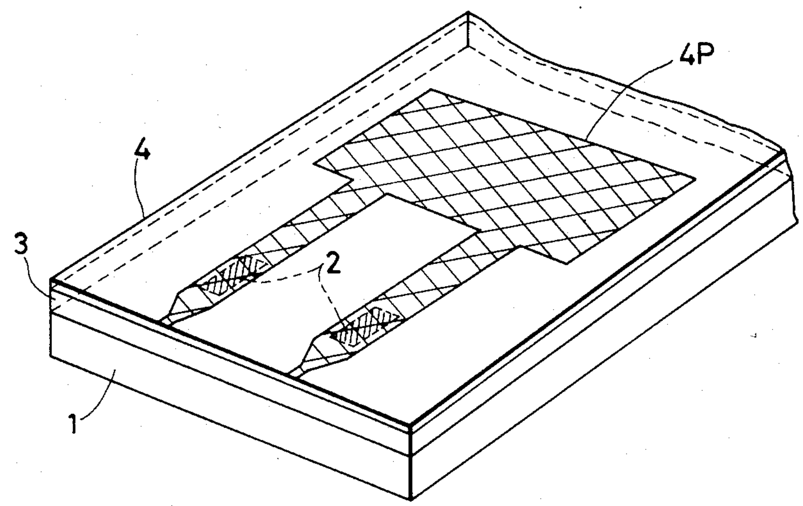

Subsequently, as shown in FIG. 4, on the dry film layer 3 provided on the substrate surface 1A, a photomask 4 having a pattern 4P with a desired shape which does not transmit the active energy ray is superposed, and then exposure is effected from above the photomask 4.

Registration between the photomask 4 and the substrate 1 is effected so that the above element 2 may be positioned in the liquid passage region finally formed after the steps of exposure and developing processing, etc., for example, according to the method in which registration marks are previously drawn respectively on the substrate 1 and the mask 4 and registration is effected following the marks.

By carrying out such an exposure, the portion other than that covered with the pattern, namely the portion exposed of the dry film layer 3 is cured by polymerization, to become insoluble in a solvent, while the unexposed portion remains soluble in a solvent.

The active energy ray to be used for such a pattern exposure may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 $mW/cm^2$ to 100 $mW/cm^2$ at the wavelength in the vicinity of 365 nm at a distance between the lamp and the material to be irradiated which is practically permissible. The electron beam irradiation device is not particularly limited, but a device having a dose within the range of 0.5 to 20 M Rad is practically suitable.

Figure 5A:
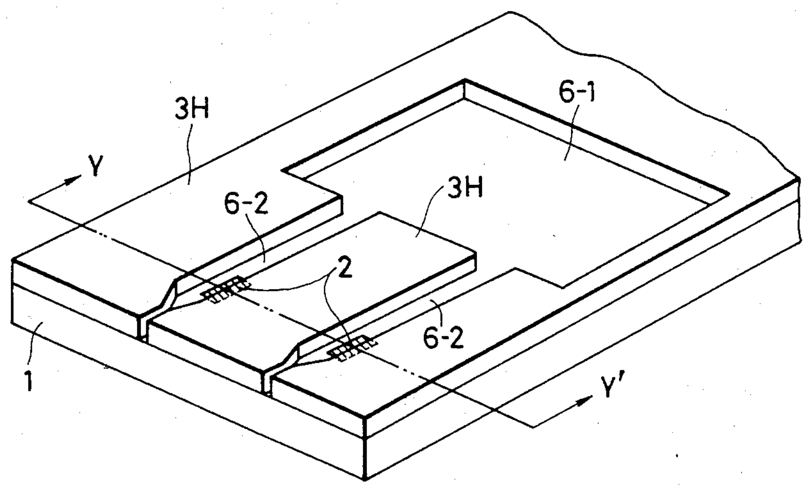
Figure 5B:
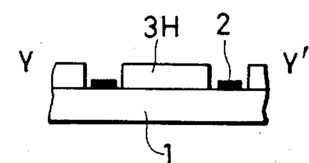

After completion of the pattern exposure of the dry film layer 3, the dry film 3 subjected to exposure is developed by, for example, dipping in a volatile organic solvent such as 1,1,1-trichloroethane, etc., to remove by dissolution the unpolymerized (uncured) portion of the dry film layer 3 which is solvent soluble, thereby forming the grooves which will finally become the liquid passages 6-2 and liquid chamber 6-1 with the resin cured film 3H remaining on the substrate 1 as shown in FIG. 5A and FIG. 5B.

As the next step, in such a case where a heat curable linear polymer is used in the active energy ray-curing resin composition the cured resin film 3H on the substrate is subjected to heat polymerization by heating, for example, at a temperature of 100° C. for about 10 minutes.

In the recording head of this embodiment, the grooves for liquid passages 6-2 and liquid chamber 6-1 are formed by referring to an example using a resin composition of the dry film type, namely a solid composition. However, the active energy ray-curing resin composition which can be used in formation of the recording head of the present invention is not limited to only solid compositions, but also a liquid composition may be available.

As the method for forming a layer comprising the composition by use of a liquid resin composition on the substrate, there may be employed, for example, the method according to squeezee as used in preparation of a relief image, namely the method in which a wall with a height corresponding to the desired thickness of the resin composition layer to be formed is provided around the substrate and superfluous resin composition is removed by means of a squeezee, etc. In this case, the resin composition may appropriately have a viscosity of 100 cp to 3000 cp. The height of the wall placed around the substrate is also required to be determined in view of the amount reduced by evaporation of the solvent contained in the light-sensitive resin composition.

When a solid resin composition is employed, it is suitable to use the method in which a dry film is plastered on the substrate by pressure contact under heating.

However, in forming the recording head of the present invention, a solid film type is convenient in handling and also with respect to easy and correct control of the thickness.

Figure 6A:
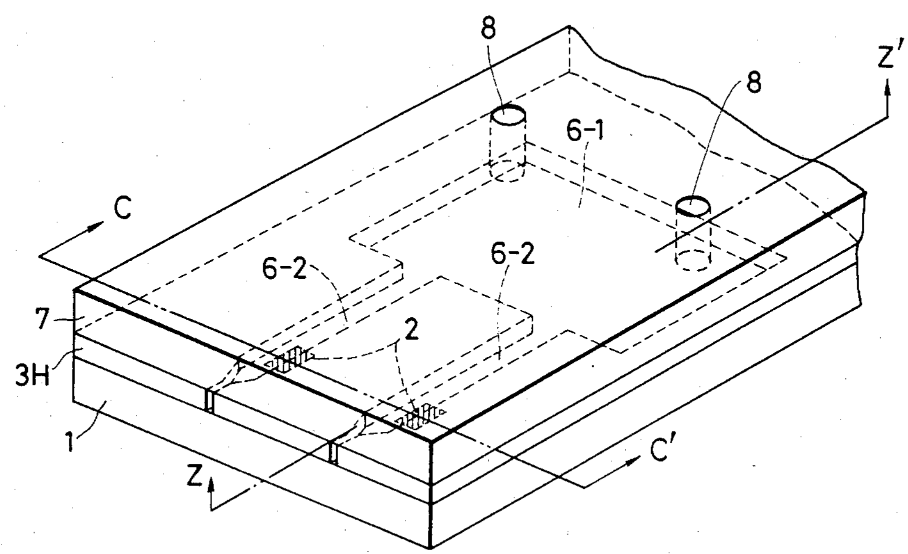
Figure 6B:
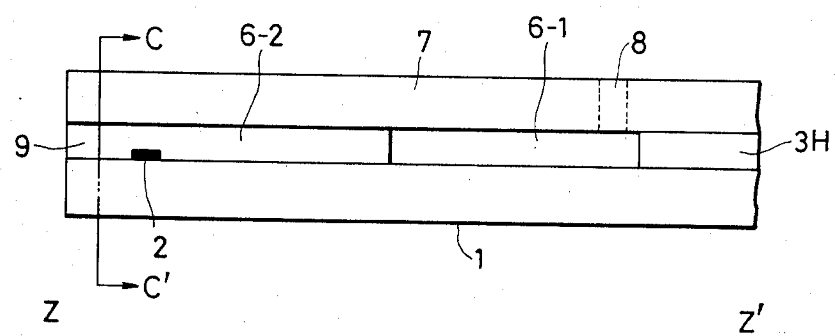

After having thus formed the grooves for constituting finally the liquid passages 6-2 and the liquid chamber 6-1 with the resin cured film 3H, a flat plate 7 which is a covering over the grooves is bonded with an adhesive on the resin cured film 3H to form a bonded body, as shown in FIG. 6A and FIG. 6B.

In the steps shown in FIG. 6A and FIG. 6B, as the specific method for providing the covering 7, for example, after the flat plate 7 of glass, ceramic, metal, plastic, etc., is applied with an epoxy resin type adhesive by spin coating to a thickness of 3 to 4 μm, the adhesive layer is previously heated to effect the so-called B-staging and then plastered on the cured dry film 3H, followed by main curing of the above adhesive layer. However, it is also possible to use no adhesive such as by having a flat plate 7 of a thermoplastic resin such as acrylic resin, ABS resin, polyethylene, etc., thermally fused directly onto the resin cured film 3H.

It is also preferable to use the method in which a resin layer comprising the resin composition for formation of the resin cured film in the present invention is provided on the covering 7 on the side to be bonded to the liquid passages, the resin layer is thermally fused to the resin cured film 3H having formed liquid passages thereon and thereafter heated with irradiation of an active energy ray, namely the method of using the resin composition for formation of the resin cured film in the present invention as the adhesive.

In FIG. 6, 6-1 shows a liquid chamber, 6-2 liquid passages and 8 the through-holes for connecting feeding pipes (not shown) for feeding the liquid for recording to the liquid chamber 6-1 from outside of the recording head not shown.

After having completed thus the bonding between the resin cured film 3H provided on the substrate 1 and the flat plate 7, the bonded body is cut along C—C′ positioned on the downstream side of the liquid passage 6-2 shown in FIG. 6A and FIG. 6B, thereby forming an orifice for discharging the liquid for recording which is the opening portion of the liquid passage at the cut surface.

This step is conducted for making the interval between the discharge energy generating element 2 and the orifice 9 adequate, and the region to be cut may be selected suitably. For this cutting, there may be employed the dicing method, etc., which is conventionally employed in semiconductor industries.

The downstream portion of the liquid passage as mentioned in the present invention refers to the region on the downstream side in the flow direction of the liquid for recording when recording is performed by use of a recording head, more specifically the portion of the liquid passage downstream of the position where the discharge energy generating element 2 is located.

After completion of cutting, the cut surface is smoothened by polishing and a feeding pipe 10 is mounted on the through-hole 8 to complete a liquid jet recording head as shown in FIG. 1.

In the recording head as described above, the liquid passages 6-2 and the liquid chamber 6-1 are formed integrally with a resin cured film 3H, but the recording head of the present invention is not limited to such a structure, and it is also possible to use a structure in which liquid passages are formed separately from the liquid chamber. However, even if any structure may be taken, the recording head of the present invention is such that at least a part of the resin for forming the liquid passage is formed by use of the active energy ray-curing resin composition as described above.

The liquid jet recording head of the present invention uses as the active energy ray curing type resin composition which is the constitutional member of said head a composition having very excellent sensitivity to the active energy ray and resolution as the pattern forming material which are imparted primarily by the monomer (ii) having ethylenically unsaturated bonds, the epoxy resin (iii) and the polymerization initiator (iv) generating Lewis acid contained as the essential components in said composition, and it has been rendered possible to obtain a liquid jet recording head excellent in dimensional precision with good yield by use of said active energy ray curing type resin composition.

Also, the active energy ray curing type resin composition for formation of the resin cured film to be used in the present invention utilizes effectively the characteristics of the graft copolymerized polymer (i) and the epoxy resin (iii) as the essential components, namely having, in addition to excellent adhesion to a substrate and mechanical strength imparted primarily by the graft copolymerized polymer (i), excellent chemical resistance and dimensional stability imparted primarily by the epoxy resin (iii), whereby it has been also rendered possible to obtain a recording head having durability for a long term by use of said composition.

Further, when the active energy ray curing type resin composition using the graft copolymerized polymer having curability is used, it is possible to obtain a liquid jet recording head which is particularly excellent in the above adhesiveness, mechanical strength or chemical resistance.

The present invention is described in more detail by referring to the following Synthetic examples and Examples.

SYNTHETIC EXAMPLE 1

A living polymer (2-hydroxyethyl methacrylate/2-butyl acrylate=80/20 weight ratio) obtained by anion polymerization was allowed the react with p-vinylbenzylchloride to obtain a macromonomer (p-vinylbenzylpoly-2-hydroxyethyl methacrylate/butyl acrylate) with a weight average molecular weight of about 1800 having a vinyl group at one terminal end of the molecular chain. Solution polymerization of 30 parts by weight of the macromonomer and 70 parts by weight of methyl methacrylate in methyl cellosolve gave a thermoplastic graft copolymerized polymer having a weight average molecular weight of $7.0\times10^4$ (this is called GP-1). The polymethyl methacrylate chain constituting the main chain of the GP-1 has a glass transition point of 100° C.

By use of the GP-1, an active energy ray curing type resin composition was prepared as follows.

| | |
|---|---|
| GP-1 | 100 parts by weight |
| Epikote 1001*1 | 50 parts by weight |
| Epikote 152*2 | 20 parts by weight |
| Celloxide 2021*3 | 30 parts by weight |
| Triphenylsulfonium tetrafluoroborate | 10 parts by weight |
| Crystal Violet | 0.5 parts by weight |
| Hydroquinone | 0.2 parts by weight |
| Toluene | 100 parts by weight |
| Methyl ethyl ketone | 200 parts by weight |

*1 bisphenol A type epoxy resin produced by Yuka-Shell Epoxy K.K.; epoxy equivalent, 450–500

*2 cresol-novolac type epoxy resin produced by Yuka-Shell Epoxy K.K.; epoxy equivalent, 172–179

*3 alicyclic type epoxy resin produced by Dicell Kagaku K.K.; epoxy equivalent, 128–145

The composition was applied by a bar coater on a 16 μm polyethylene terephthalate film (Lumilar T type) to a thickness after drying of 75 μm. The coated film was protected by pressure lamination of a 25 μm polyethylene film thereon, and this was used in the subsequent formation of the recording head of the present invention.

SYNTHETIC EXAMPLE 2

A living polymer (N-methylolmethacrylamide/2-hydroxyethyl methacrylate=30/70 weight ratio) obtained by anion polymerization was allowed to react with p-vinylbenzylchloride to obtain a macromonomer (p-vinylbenzyl poly-N-methylol-methacrylamide/2-hydroxyethyl methacrylate) with a weight average molecular weight of about 1500 having a vinyl group at one terminal end of the molecular chain.

Solution polymerization of 30 parts by weight of the macromonomer and 70 parts by weight of methyl methacrylate in methyl cellosolve gave a heat crosslinkable graft copolymerized polymer having a weight average molecular weight of $7.7\times10^4$ (this is called GP-2). The polymethyl methacrylate chain constituting the main chain of the GP-2 has a glass transition point of 100° C. By use of the GP-2, an active energy ray curing type resin composition having the following composition was prepared.

| | |
|---|---|
| GP-2 | 160 parts by weight |
| Epikote 828*4 | 20 parts by weight |
| Celloxide 2021 | 20 parts by weight |
| Diphenyliodonium tetrafluoroborate | 5 parts by weight |
| P—toluenesulfonic acid | 4 parts by weight |
| Crystal Violet | 0.5 parts by weight |
| Hydroquinone | 0.1 parts by weight |
| 1,1,1-Trichloroethane | 200 parts by weight |
| Methyl cellosolve | 200 parts by weight |

*4 bisphenol A type epoxy resin produced by Yuka-Shell Epoxy K.K.; epoxy equivalent, 183–193

The composition was applied by a bar coater on a 16 μm polyethylene terephthalate film (Lumilar T type) to a thickness after drying of 75 μm. The coated film was protected by pressure lamination of a 25 μm polyethylene film thereon, and this was used for the subsequent formation of the recording head of the present invention.

SYNTHETIC EXAMPLE 3

A living polymer (N-butoxymethylacrylamide/2-hydroxyethyl methacrylate =70/30 weight ratio) obtained by anion polymerization was allowed to react with acrylic acid chloride to obtain a macromonomer (acrylic acid poly-butoxymethylacrylamide/2-hydroxyethyl methacrylate) with a weight average molecular weight of about 3000 having a vinyl group at one terminal end of the molecular chain.

Copolymerization of 25 parts by weight of the macromonomer, 70 parts by weight of methyl methacrylate and 5 parts by weight of acrylonitrile was carried out in methyl cellosolve to obtain a graft copolymerized polymer having heat crosslinkability with a weight average molecular weight of $6.8\times10^4$ (this is called GP-4). The copolymerized polymer chain of methyl methacrylate and acrylonitrile constituting the main chain of the GP-4 has a glass transition point of 105° C.

By use of the GP-4, an active energy ray curing type resin composition was prepared as follows:

| | |
|---|---|
| GP-4 | 40 parts by weight |
| Epicrone 828 | 80 parts by weight |
| Epicrone N-730*7 | 80 parts by weight |
| Triphenylsulfonium tetrafluoroborate | 12 parts by weight |
| P—toluenesulfonic acid | 4 parts by weight |
| Crystal Violet | 0.5 parts by weight |
| Hydroquinone | 0.1 parts by weight |
| Methyl cellosolve | 300 parts by weight |
| Ethanol | 50 parts by weight |

*7 phenol-novolac type epoxy resin produced by Dainippon Ink Kagaku Kogyo K.K.; epoxy equivalent 170–190

The composition was applied by a bar coater to a thickness of 75 μm after drying on a 16 μm polyethylene terephthalate film (Lumilar T type), followed by drying at 100° C. for 10 minutes to form a dry film having an active energy ray curing type resin composition layer subsequent formation of the recording head of the present invention.

SYNTHETIC EXAMPLE 4

According to the same procedure as Synthetic example 1 except for controlling the composition of the active energy ray curing type resin composition as shown below by use of the thermoplastic graft copolymerized polymer GP-1 obtained in Synthetic example 1, a dry film having the active energy ray curing type resin composition layer was formed and used in the subsequent formation of the recording head of the present invention.

| | |
|---|---|
| GP-1 | 100 parts by weight |
| Epikote 828 | 60 parts by weight |
| Epikote 1001 | 50 parts by weight |
| Celloxide 2021 | 40 parts by weight |
| Triphenylsulfonium hexafluoroantimony | 10 parts by weight |
| P—toluenesulfonic acid | 4 parts by weight |
| Crystal Violet | 0.5 parts by weight |
| Hydroquinone | 0.1 parts by weight |

-continued

| | |
|---|---|
| Methyl cellosolve | 350 parts by weight |

SYNTHETIC EXAMPLE 5

According to the same procedure as Synthetic example 2 except for controlling the composition of the active energy ray curing type resin composition as shown below by use of the heat crosslinkable graft copolymerized polymer GP-2 obtained in Synthetic example 2, a dry film having the active energy ray curing type resin composition layer was formed and used in the subsequent formation of the recording head of the present invention.

| | |
|---|---|
| GP-2 | 100 parts by weight |
| Epikote 1001 | 100 parts by weight |
| Diphenyliodonium tetrafluoroborate | 10 parts by weight |
| P—toluenesulfonic acid | 4 parts by weight |
| Crystal Violet | 0.5 parts by weight |
| Hydroquinone | 0.1 parts by weight |
| Methyl cellosolve | 350 parts by weight |

EXAMPLE 1

By use of the dry film prepared in Synthetic example 1, following the steps of FIG. 1 to FIG. 6 as described previously in the specification, an on-demand type liquid jet recording head having 10 orifices (orifice dimension: 75 μm×50 μm, pitch 0.125 mm) with heat generating elements [hafnium boride ($HfB_2$)] as the discharge energy generating element was prepared as follows. Thirty recording heads were prepared in the same shape.

First, a plurality of heat generating elements were arranged at the predetermined positions on the substrate comprising silicon and electrodes for applying recording signals were connected to these.

Next, an $SiO_2$ layer (thickness 1.0 μm) as the protective film was provided on the substrate surface having the heat generating elements arranged thereon, and the surface of the protective layer was cleaned and dried. Then, the dry film obtained in the above Synthetic example 1, heated to 80° C. was laminated by a hot roll type laminator (trade name HRL-24, produced by Du Pont Co.) on the protective layer at a roll temperature of 80° C. at a speed of 0.4 f/min. under the pressurizing condition of 1 kg/cm$^2$.

In this state, the layer constituted of the active energy ray-curing resin composition has the polyethyleneterephthalate film laminated on its surface.

Subsequently, on the dry film provided on the substrate surface, a photomask having a pattern corresponding to the shapes of liquid passages and liquid chamber was superposed and, after performing registration so that the above element may be provided in the liquid passages to be finally formed, the dry film was exposed to UV-ray using an exposure light source with deep UV lamp (trade name PLA-501, produced by Canon K.K.) with a luminance of 8 mW/cm$^2$ on the irradiated surface from above the photomask for 150 seconds.

After exposure, the polyethyleneterephthalate film was peeled off from the layer comprising the active energy ray curing type resin composition subjected to pattern exposure, the dry film exposed was developed in a sonication washing machine using a mixture of 1,1,1-trichloroethane/ethanol (=70/30 weight ratio) at 35° C. for 60 seconds to remove by dissolution the unpolymerized (uncured) portion of the dry film from the substrate, thereby forming grooves which will become finally the liquid passages and liquid chamber with the cured dry film remaining on the substrate.

After completion of development, the cured dry film on the substrate was heated at 80° C. for one hour, subjected to post-exposure of 10 J/cm$^2$, further followed by heating at 160° C. for 60 minutes to further cure the film.

After having formed thus the grooves for the liquid passages and liquid chamber with the cured dry film, a flat plate comprising soda glass provided with a through-hole which becomes the covering over the groove formed was applied with an epoxy type resin adhesive to a thickness of 3 μm by spin coating, then preheated to effect B-staging and plastered on the cured dry film, followed further by main curing of the adhesive to effect adhesion fixing, thus forming a bonded body.

Subsequently, on the downstream side of the liquid passage of the bonded body, namely at the position of 0.150 mm toward the downstream side from the position where the discharge energy generating element is located, the bonded body was cut vertically relative to the liquid passage by means of a commercially available dicing saw (trade name: DAD 2H/6 model, produced by DISCO Co.) to form orifices for discharging the liquid for recording.

Finally, the cut surfaces were washed and dried, further smoothened by polishing, and feeding pipes for feeding the liquid for recording were mounted at the through-holes to complete the liquid jet recording head. Every one of the recording heads obtained was found to have liquid passages and liquid chamber which have faithfully reproduced the mask pattern and to be excellent in dimensional precision. The orifice dimension was within 50±5 μm and an orifice pitch within 125±5 μm.

The recording heads thus prepared were tested for quality and durability during prolonged use as follows.

First, for the recording heads obtained, durability test was conducted by dipping in the liquids for recording having the respective compositions shown below at 60° C. for 1000 hours (the environmental conditions comparable to prolonged use of recording head).

Liquid components for Recording (1) $H_2O$/ethyleneglycol/diethyleneglycol/propyleneglycol/C.I. Direct Black 154*1/Emulgen 931*4
(=64/20/5/5/6/0.2 weight parts)
pH=8.0

(2) $H_2O$/triethyleneglycol/glycerine/C.I. Hood Black 2*2/Emulgen 931*4/PVP K-30*5
(=80/15/2/3/0.1/0.1 weight parts)
pH=9.0

(3) H20/ethyleneglycol/diethyleneglycol/polyethyleneglycol #300/N-methyl-2-pyrrolidone/C.I. Food Black 2*2/Emulgen 931*4
(=55/10/20/5/5/5/0.2 weight parts)
pH=7.0

(4) $H_2O$/diethyleneglycol/polyethyleneglycol #200/1,3-dimethyl-2-imidazolidinone/C.I. Direct Blue 86*3/Emulgen 931*4/PVP K-30*5
(=62/15/15/5/3/0.1/0.1 weight parts)
pH=10.0

(Note) *1 to *3 are water-soluble dyes, *4 is a trade name of a polyoxyethylene nonylphenyl ether produced by Kao soap K.K. and *5 is a trade name of a polyvinylpyrrolidone produced by GAF, U.S.A.; and sodium hydroxide was employed for adjustment of pH.

After the durability test, each head subjected to said test was observed about the bonded state between substrate and the covering and the dry film. As the result, no peel-off or damage could be recognized in all of the recording heads, but good adhesiveness was exhibited.

Next, separately for the other 10 recording heads obtained, each head was mounted on a recording device, and the printing test was practiced by use of the above liquid for recording by applying recording signals of $10^8$ pulse continuously on the recording head for 14 hours. For each recording head, immediately after initiation of printing and after elapse of 14 hours, substantially no lowering in both of the discharging performance and printed state could be recognized. Thus, the recording heads were found to be excellent in durability.

EXAMPLE 2

A liquid jet recording head was prepared in the same manner as Example 1, except for using the dry film prepared in Synthetic example 2.

Further, for each of the recording heads prepared, the same durability test and printing test were conducted in the same manner as Example 1.

After the durability test, each head subjected to said test was observed about the bonded state between substrate and the covering and the dry film. As the result, no peel-off or damage could be recognized in all of the recording heads, but good adhesiveness was exhibited.

Also, in the printing test, for each recording head, immediately after initiation of printing and after elapse of 14 hours, substantially no lowering in both of the discharging performance of the liquid for recording and the printed state could be recognized. Thus, the recording heads were found to be excellent in durability.

EXAMPLE 3

By use of the dry film prepared in Synthetic example 3, this was laminated on a substrate by means of a hot roll type laminator (trade name, HRL-24, produced by Du Pont Co.) at a roll temperature of 80° C., a roll pressure of 1 Kg/cm$^2$, and a laminating speed of 1 m/min., and then subjected to a pattern exposure by means of a high pressure mercury lamp as the exposure light source at a luminance of 34 mW/cm$^2$ in the vicinity of 254 nm on the irradiated surface. Further, after the polyethyleneterephthalate film was peeled off from the active energy ray curing type resin composition layer (dry film) subjected to pattern exposure, the layer was developed by spraying a mixture of 1,1,1-trichloroethane/butyl cellosolve (=70/30 weight ratio), at 35° C. for 60 seconds. Then, the cured dry film on the substrate was heated at 80° C. for 10 minutes, subsequently subjected to post-exposure of 10 J/cm$^2$, followed by heating at 50° C. for 60 minutes to cure further the film.

Except for using the cured resin obtained above, following the same procedure as Example 1, a liquid jet recording head was prepared.

Further, for each of the recording heads prepared, the same durability test and printing test were conducted in the same manner as Example 1.

After the durability test, each head subjected to said test was observed about the bonded state between substrate and the covering and the dry film. As the result, no peel-off or damage could be recognized in all of the recording heads, but good adhesiveness was exhibited.

Also, in the printing test, for each recording head, immediately after initiation of printing and after elapse of 14 hours, substantially no lowering in both of the discharging performance of the liquid for recording and printed state could be recognized. Thus, the recording head was found to be excellent in durability.

EXAMPLES 4 and 5

A liquid jet recording head was prepared in the same manner as Example 1, except for using the dry films obtained in Synthetic examples 4 and 5, respectively.

Further, for each of the recording heads prepared, the same durability test and printing test were conducted in the same manner as Example 1.

After the durability test, each head subjected to said test was observed about the bonded state between substrate and the covering and the dry film. As the result, no peel-off or damage could be recognized in all of the recording heads, but good adhesiveness was exhibited.

Also, in the printing test, for each recording head, immediately after initiation of printing and after elapse of 14 hours, substantially no lowering in performance in both of the discharging performance of the liquid for recording and printed state could be recognized. Thus, the recording head was found to be excellent in durability.

SYNTHETIC EXAMPLE 6

A living polymer (3-chloro-2-hydroxypropyl methacrylate/N-vinylpyrrolidone =90/10 weight ratio) obtained by anion polymerization was allowed to react with acrylic acid chloride to obtain a macromonomer (acrylic acid poly-3-chloro-2-hydroxypropyl methacrylate/N-vinylpyrrolidone) with a weight average molecular weight of about 2500 having a vinyl group at one terminal end of the molecular chain. Copolymerization of 25 parts by weight of the macromonomer, 65 parts by weight of methyl methacrylate and 10 parts by weight of dimethylaminoethyl methacrylate was carried out in methyl isobutyl ketone (weight average molecular weight: $6.5\times10^4$). Subsequently, to the polymer solution containing 100 parts by weight of the copolymer dissolved therein, 11 parts by weight of a partial urethane compound obtained by reacting hexamethylene diisocyanate with 2-hydroxyethyl acrylate to a ratio of NCO group equivalent: OH group equivalent =2.0: 1.1 was added to carry out the reaction, whereby 30% of the 3-chloro-2-hydroxypropyl methacrylate component was converted to the acrylic urethane to give a graft copolymerized polymer having photopolymerizable acrylic ester groups at the graft chains (this is called GP-3). The copolymerized polymer chain of methyl methacrylate and dimethylaminoethyl methacrylate constituting the main chain of the GP-3 has a glass transition point of 90° C. By use of the above GP-3, an active energy ray curing resin composition was prepared as follows:

| | |
|---|---|
| GP-3 | 100 parts by weight |
| Epicrone 840*5 | 20 parts by weight |
| Epicrone 830*6 | 20 parts by weight |
| Epicrone N-730*7 | 20 parts by weight |
| Acrylic acid ester of triglycidyl ether of trimethylolpropane | 40 parts by weight |
| Diphenyliodonium tetrafluoroborate | 10 parts by weight |

-continued

| | |
|---|---|
| Irugacure 651 | 15 parts by weight |
| Crystal Violet | 1 parts by weight |
| Hydroquinone | 0.2 parts by weight |
| Methyl Cellosolve acetate | 300 parts by weight |

*5 bisphenol A type epoxy resin produced by Dainippon Ink Kagaku Kogyo K.K.; epoxy equivalent 180–190
*6 bisphenol F type epoxy resin produced by Dainippon Ink Kagaku Kogyo K.K.; epoxy equivalent 170–190
*7 phenol-novolac type epoxy resin produced by Dainippon Ink Kagaku Kogyo K.K.; epoxy equivalent 170–190

The resin composition was applied by a wire bar coater on a 16 μm polyethyleneterephthalate film, followed by drying at 100° C. for 20 minutes to form a dry film comprising a 75 μm resin composition layer of the present invention.

EXAMPLE 6

By use of the dry film prepared in Synthetic example 6, following the steps of FIG. 1 to FIG. 6 as described previously in the specification, an on-demand type liquid jet recording head having 10 orifices (orifice dimension: 75 μm×50 μm, pitch 0.125 mm) with heat generating elements [hafnium boride ($HfB_2$)] as the discharge energy generating element was prepared as follows. Thirty recording heads were prepared in of the same shape.

First, a plurality of heat generating elements were arranged at the predetermined positions on the substrate comprising silicon and electrodes for applying recording signals were connected to these.

Next, an $SiO_2$ layer (thickness 1.0 μm) as the protective film was provided on the substrate surface having the heat generating elements arranged thereon, and the surface of the protective layer was cleaned and dried. Then, the dry film with a thickness of 75 μm as shown in the above Synthetic example 6 heated to 80° C. was laminated on the protective layer at a speed of 0.4 f/min. under the pressurizing condition of 1 kg/cm$^2$.

Subsequently, on the dry film provided on the substrate surface, a photomask having a pattern corresponding to the shapes of liquid passages and liquid chamber was superposed and, after performing registration so that the above element may be provided in the liquid passages finally formed, the dry film was exposed to UV-ray with an intensity of 12 mW/cm$^2$ from above the photomask for 30 seconds.

Next, the dry film exposed was developed by dipping in 1,1,1-trichloroethane to remove by dissolution the unpolymerized (uncured) portion of the dry film from the substrate, thereby forming grooves which will become finally the liquid passages and liquid chamber with the cured dry film remaining on the substrate.

After completion of development, the cured dry film on the substrate was heated at 150° C. for one hour, followed further by irradiation of UV-ray with an intensity of 50 mW/cm$^2$ for 2 minutes to further cure the film.

After having formed thus the grooves for the liquid passages and liquid chamber with the cured dry film, a flat plate comprising soda glass provided with a through-hole which becomes the covering over the groove formed was applied with an epoxy type resin adhesive to a thickness of 3 μm by spin coating, then preheated to effect B-staging and plastered on the cured dry film, further followed by main curing of the adhesive to effect adhesion fixing, thus forming a bonded body.

Subsequently, on the downstream side of the liquid passage of the bonded body, namely at the position of 0.150 mm toward the downstream side from the position where the discharge energy generating element is located, the bonded body was cut vertically relative to the liquid passage by means of a commercially available dicing saw (trade name: DAD 2H/6 model, produced by DISCO Co.) to form orifices for discharging the liquid for recording.

Finally, the cut surfaces were washed and dried, further smoothend by polishing and feeding pipes for feeding the liquid for recording were mounted at the through-holes to complete the liquid jet recording head. Every one of the recording heads obtained was found to have liquid passages and liquid chamber which faithfully reproduced the mask pattern and to be excellent in dimensional precision. The orifice dimension was within 50±5 μm and an orifice pitch within 125±5 μm.

The recording heads thus prepared were tested for quality and durability during prolonged use as follows.

First, for the recording heads obtained, durability test was conducted by dipping in the liquids for recording having the respective compositions shown below at 60° C. for 1000 hours (the environmental conditions comparable to prolonged use of recording head).

Liquid Components for Recording (1) $H_2O$/ethyleneglycol/diethyleneglycol/polyethyleneglycol #300/polyethyleneglycol #400/N-methyl-2-pyrrolidone/C.I.Food Black 2*1
(=65/10/10/5/5/2/3 weight parts)
pH=8.0

(2) $H_2O$/diethyleneglycol/glycerine/triethyleneglycol monomethylether/C.I. Direct Blue 86*2/PVK K-30*4
(=72/5/5/15/3/0.1 weight parts)
pH=9.0

(3) $H_2O$/triethyleneglycol/polyethyleneglycol #200/polyethyleneglycol #400/C.I. Direct Black 154*3/Emulgen 931*5
(=67/15/5/8/5/0.1 weight parts)
pH=7.0

(4) $H_2O$/ethyleneglycol/diethyleneglycol/polyethyleneglycol #400/propyleneglycol/C.I. Direct Black 154/Emulgen 931
(=63/10/5/5/10/7/0.1 weight parts)
pH=10.0

(Note) *1 to *3 are water-soluble dyes, *4 is a polyoxyethylene nonylphenyl ether produced by Kao soap K.K. and *5 is a polyvinylpyrrolidone produced by GAF, U.S.A.; and sodium hydroxide was employed for adjustment of pH.

For each liquid for recording, 5 recording heads were provided for durability test.

After the durability test, each head subjected to said test was observed about the bonded state between substrate and the covering and the dry film. As the result, no peel-off or damage could be recognized in all of the recording heads, but good adhesiveness was exhibited.

Next, separately for the other 10 recording heads obtained, each head was mounted on a recording device, and the printing test was practiced by use of the above liquid for recording by applying recording signals of $10^8$ pulse continuously on the recording head for 14 hours. For each recording head, immediately after initiation of printing and after elapse of 14 hours, substantially no lowering in both of the discharging performance of the liquid for recording and printed state could be recognized. Thus, the recording head was found to be excellent in durability.

COMPARATIVE EXAMPLE 1

Recording heads were prepared in the same manner as Example 1 except for using a commercially available dry film Vacrel with a thickness of 75 μm (trade name of dry film solder mask, produced by Du Pont de Nemours Co.) and a commercially available dry film Photec SR-3000 with a film thickness of 50 μm (trade name, produced by Hitachi Kasei Kogyo K.K.).

For these recording heads, the same durability test as Example 1 was practiced.

In the course of durability test, when employing Vacrel as the dry film, peel-off was recognized after 100 hours with the liquids for recording (2) and (4). Also, after 300 hours, peel-off was recognized with the liquids for recording (1) and (3).

On the other hand, when employing Photec SR-3000 as the dry film, peel-off was recognized after 300 hours with a respective liquids for recording of (1) to (4).

We claim:

1. A liquid jet recording head, having a liquid passage communicated to the discharging outlet of the liquid provided on a substrate surface, said passage being formed by subjecting a layer of a resin composition curable with an active energy ray to a predetermined pattern exposure with the use of said active energy ray to thereby form a cured region of said resin composition and removing the uncured region from said layer, said resin composition comprising:

(i) a graft copolymerized polymer comprising a trunk chain composed mainly of structural units derived from at least one monomer selected from the group consisting of alkyl methacrylates, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinylpyrrolidone or its derivatives, (E) vinylpyridine or its derivatives and (F) acrylamide derivatives represented by the following formula I:

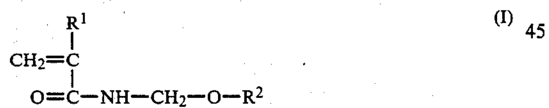

(wherein $R^1$ is hydrogen or an alkyl or hydroxyalkyl group having 1 to 3 carbon atoms, and $R^2$ is hydrogen or an alkyl or acyl group having 1 to 4 carbon atoms which may have hydroxy group ), added to said trunk chain;

(ii) a monomer having an ethylenically unsaturated bond;

(iii) an epoxy resin comprising at least one compound having one or more epoxy groups in the molecule; and (iv) a polymerization initiator capable of generating a Lewis acid by irradiation of an active energy ray.

2. A liquid jet recording head according to claim 1, wherein the contents of said graft copolymerized polymer (i), said monomer (ii) and said resin (iii) are such that $G/(G+M+E)$ is within the range from 0.2 to 0.8. and $E/(E+M)$ is within the range from 0.3 to 0.7, when the content of said graft copolymerized polymer (i) is defined as G parts by weight, that of said monomer (ii) as M parts by weight and that of said resin (iii) as E parts by weight, and said polymerization initiator (iv) is contained in an amount within the range from 0.2 to 15 parts by weight per 100 parts by weight of $(G+M+E)$.

3. A liquid jet recording head according to claim 1, wherein said polymerization initiator (iv) comprises an aromatic halonium salt compound or an aromatic onium salt compound having photosensitivity containing an element belonging to group VIa or group Va, of the periodic table.

4. A liquid jet recording head according to claim 1, wherein said resin composition comprises 0.1 to 20 parts by weight of a radical polymerization initiator which can be activated by an active energy ray per 100 parts by weight of the total amount of said graft copolymerized polymer (i), said monomer (ii) and said resin (iii).

5. A liquid jet recording head, having a liquid passage communicated to the discharging outlet of the liquid provided on a substrate surface, said passage being formed by subjecting a layer of a resin composition curable with an active energy ray to a predetermined pattern exposure with the use of said active energy ray to thereby form a cured region of said resin composition and removing the uncured resin from said layer, said resin composition comprising:

(i) a graft copolymerized polymer comprising a trunk chain composed mainly of structural units derived from at least one monomer selected from the group consisting of alkyl methacrylate, acrylonitrile and styrene, having graft chains composed mainly of structural units derived from at least one monomer selected from the group consisting of (A) hydroxyl containing acrylic monomers, (B) amino or alkylamino containing acrylic monomers, (C) carboxyl containing acrylic or vinyl monomers, (D) N-vinylpyrrolidione or its derivatives, (E) vinylpyridine or its derivatives and (F) acrylamide derivatives represented by the following formula I:

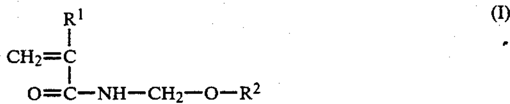

(wherein $R^1$ is hydrogen or an alkyl or hydroxyalkyl group having 1 to 3 carbon atoms, and $R^2$ is hydrogen or an alkyl or acyl group having 1 to 4 carbon atoms which may have hydroxyl group), added to said trunk chain;

(iii) an epoxy resin comprising at least one compound having one or more epoxy groups in the molecule; and (iv) a polymerization initiator capable of generating a Lewis acid by irradiation of an active energy ray.

6. A liquid jet recording head according to claim 5, wherein the contents of said graft copolymerized polymer (i) and said resin (iii) are such that $G/(G+E)$ is within the range from 0.2 to 0.8 when the content of said graft copolymer (i) is defined as G parts by weight and that of said resin (iii) as E parts by weight, and said polymerization initiator (iv) is contained in an amount within the range from 0.2 to 15 parts by weight per 100 parts by weight of $(G+E)$.

7. A liquid jet recording head according to claim 5, wherein said polymerization initiator (iv) comprises an aromatic halonium salt compound or an aromatic onium salt compound having photosensitivity containing an element belonging to group VIa or, group Va, of the periodic table.

* * * * *

UNITED STATES PATENT AND TRADEMARK OFFICE
CERTIFICATE OF CORRECTION

PATENT NO. : 4,688,056

DATED : August 18, 1987

INVENTOR(S) : HIROMICHI NOGUCHI, ET AL.

It is certified that error appears in the above-identified patent and that said Letters Patent is hereby corrected as shown below:

COLUMN 1

Line 20, "little" should read --little to--.
Line 22, delete "a" (both occurrences).

COLUMN 2

Line 32, "may marked" should read --may cause marked--.

COLUMN 3

Line 53, "liquid recording" should read --liquid jet recording--.

COLUMN 5

Line 67, "4-(4-pipenilinoethyl)pyridine" should read --4-(4-piperidinoethyl)pyridine--.

COLUMN 6

Line 60, "preferably" should read --preferable--.

COLUMN 7

Line 66, "weightaverage" should read --weight-average--.

COLUMN 9

Line 46, "ε-caploractone-" should read --ε-caprolactone- --.

UNITED STATES PATENT AND TRADEMARK OFFICE

CERTIFICATE OF CORRECTION

PATENT NO. : 4,688,056

DATED : August 18, 1987

INVENTOR(S) : HIROMICHI NOGUCHI, ET AL.

It is certified that error appears in the above-identified patent and that said Letters Patent is hereby corrected as shown below:

COLUMN 10

Line 45, delete "of" (second occurrence).

COLUMN 11

Line 8, "molsof" should read --mols of--.
Line 48, "groups" should read --group--.

COLUMN 12

Line 33, "7 of" should read --7 which is equal to the valence of M and k is an integer of--.

COLUMN 16

Line 15, before "methyl" insert --4,4'-bis(N,N-diethylamino)benzophenone, benzophenone--.
Line 32, "photopolymerication" should read --photopolymerization--.

COLUMN 18

Line 5, "is" should read --are--.

COLUMN 19

Line 9, "squeezee" should read --squeegee--.
Line 14, "squeezee," should read --squeegee,--.

UNITED STATES PATENT AND TRADEMARK OFFICE

CERTIFICATE OF CORRECTION

PATENT NO. : 4,688,056

DATED : August 18, 1987

INVENTOR(S) : HIROMICHI NOGUCHI, ET AL.

It is certified that error appears in the above-identified patent and that said Letters Patent is hereby corrected as shown below:

COLUMN 20

Line 65, "methacrylate/2-" should read --methacrylate/- --.

COLUMN 22

Line 47, "layer subsequent" should read --layer with a film thickness of 75 μm, which was used in the subsequent--.

COLUMN 24

Line 54 "C.I. Hood Black" should read --C.I. Food Black--.
Line 58, "H2O" should read --$H_2O$--.

COLUMN 27

Line 26, delete "of".

UNITED STATES PATENT AND TRADEMARK OFFICE
CERTIFICATE OF CORRECTION

PATENT NO. : 4,688,056

DATED : August 18, 1987

INVENTOR(S) : HIROMICHI NOGUCHI, ET AL.

It is certified that error appears in the above-identified patent and that said Letters Patent is hereby corrected as shown below:

COLUMN 28

Line 11, "smoothend" should read --smoothened--.
Line 15, "chamber" should read --chambers--.

COLUMN 29

Line 20, "a" should read --the--.

Signed and Sealed this

Second Day of February, 1988

*Attest:*

DONALD J. QUIGG

*Attesting Officer*

*Commissioner of Patents and Trademarks*